United States Patent
Park et al.

(10) Patent No.: US 7,212,426 B2
(45) Date of Patent: May 1, 2007

(54) FLASH MEMORY SYSTEM CAPABLE OF INPUTTING/OUTPUTTING SECTOR DATA AT RANDOM

(75) Inventors: Min-Gun Park, Gyeonggi-do (KR); Jin-Yub Lee, Seoul (KR)

(73) Assignee: Samsung Electronics Co., Ltd., Suwon-si, Gyeongg-do (KR)

( * ) Notice: Subject to any disclaimer, the term of this patent is extended or adjusted under 35 U.S.C. 154(b) by 44 days.

(21) Appl. No.: 10/957,166

(22) Filed: Sep. 30, 2004

(65) Prior Publication Data

US 2005/0141273 A1  Jun. 30, 2005

(30) Foreign Application Priority Data

Dec. 31, 2003  (KR) .................... 10-2003-0101176

(51) Int. Cl.
*G11C 13/00* (2006.01)

(52) U.S. Cl. ................ 365/120; 365/120; 365/235; 365/189.05; 257/315; 257/314

(58) Field of Classification Search ............ 257/315, 257/314; 365/185.01, 185.33
See application file for complete search history.

(56) References Cited

U.S. PATENT DOCUMENTS

| | | | | | |
|---|---|---|---|---|---|
| 5,572,466 | A | * | 11/1996 | Sukegawa | ............... 365/230.06 |
| 5,875,130 | A | * | 2/1999 | Haddad et al. | ......... 365/185.33 |
| 5,999,451 | A | * | 12/1999 | Lin et al. | ............... 365/185.11 |
| 6,163,478 | A | * | 12/2000 | Kasa et al. | ............ 365/185.01 |

* cited by examiner

*Primary Examiner*—Andy Huynh
*Assistant Examiner*—Thinh T Nguyen
(74) *Attorney, Agent, or Firm*—Marger Johnson & McCollom, P.C.

(57) ABSTRACT

A flash memory system capable of inputting/outputting data in units of sectors at random. The flash memory system includes a flash memory (a cell array), a buffer memory, a random data input/output circuit, and a control circuit. The random data input/output circuit receives data in units of sectors from the buffer memory or outputs the data in units of sectors to the buffer memory. The control circuit controls the order and the number of times of inputting/outputting data between the buffer memory and the random data input/output circuit.

12 Claims, 8 Drawing Sheets

FLASH MEMORY SYSTEM CAPABLE OF INPUTTING/OUTPUTTING SECTOR DATA AT RANDOM

CROSS-REFERENCE TO RELATED APPLICATIONS

This U.S. non-provisional patent application claims priority under 35 U.S.C. § 119 of Korean Patent Application 2003-101176 filed on Dec. 31, 2003, the entire contents of which are hereby incorporated by reference.

BACKGROUND OF THE INVENTION

The present invention relates to a flash memory system, and more specifically to a flash memory system capable of inputting/outputting data in units of sectors at random.

The flash memory is a non-volatile memory device that is capable of being highly integrated. The flash memory is used as a main memory in a flash memory system because the memory has a good ability to storeg data. The flash memory has been spotlighted as a highly integrated high capacitance device that is capable of replacing the existing hard disc and floppy disc. Presently, the flash memory has been widely used as a storage of portable digital electronic equipments such as cell phones, digital cameras, MP3 players, camcorders, PDA, etc.

However, the flash memory has a slow rate of inputting/outputting data compared to RAM. In reading and writing operations of flash memory, most of the delay time is used up to write data that is temporarily stored in a page buffer to a cell array, or to read out the data stored in the cell array to the page buffer.

In addition, a random access is impossible in the flash memory. To overcome the disadvantage of the flash memory, nWE methods for supporting a random access using a buffer memory in the flash memory system have been developed.

A flash memory system needs a buffer memory to store data temporarily before writing data in the flash memory or transmitting data to a host so as to support a random access. The buffer memory is a randomly accessible memory (e.g., a DRAM or an SRAM).

Meanwhile, the flash memory comprises a plurality of blocks (e.g., 1024 blocks or 2048 blocks). In the flash memory, the block is a basic unit of an operation of erasing data. One block comprises a plurality of pages (e.g., 16 pages, 32 pages or 64 pages). The page is a basic unit in operations of writing and reading data.

A size of one page is usually (512+16) bytes or (2K+64) bytes. When a size of one page is (2K+64) bytes, the 2K bytes corresponds to normal data and the 64 bytes corresponds to additional data. The normal data is stored in a main region and the additional data is stored in a spare region. In this case, the additional data means error correction and detection code data, address mapping data, hardware level data, etc. that are generated by means of the normal data.

The flash memory can be categorized into a small block flash memory and a large block flash memory according to the size of page. The small block flash memory has a page size of (512+16) bytes. The large block flash memory has a page size of (2K+64) bytes or more.

Using the large block flash memory may have a faster rate of inputting/outputting data than using the small block flash memory, since the large block flash memory may write a large amount of data to the cell array or read from the cell array at a time.

In addition, using the large block flash memory may reduce the size of a chip. The entire chip size can be effectively reduced by using one large block flash memory instead of several small block flash memories. Recently, the large block flash memory is mainly used to increase the rate of inputting/outputting data and to reduce the chip size.

However, the large block flash memory does not use the control method that is used in the small block flash memory. Especially, a unit of error correction and detection code, a spare region, and the like depend on the page size and should be adjusted to the page size. Therefore, a control method of the flash memory must be organized differently according to each of the small block flash memory and the large block flash memory. If the control method used in the small block flash memory is used in the large block flash memory, a region without data exists in the large block flash memory, resulting in reduced efficiency of storing data.

SUMMARY OF THE INVENTION

The present invention is directed to a flash memory system for controlling a large block flash memory in the manner of controlling small block flash memory, using a random data input/output circuit capable of inputting/outputting data at random in units of sectors.

An aspect of the present invention is to provide a flash memory comprising: a flash memory to store data in units of pages; a buffer memory to store data in units of sectors; a random data input/output circuit for receiving data in units of sectors from the buffer memory or outputting data in units of sectors to the buffer memory, and outputting data in units of pages to the flash memory or receiving data in units of pages from the flash memory; and a control circuit for controlling the order and the number of times of inputting/outputting data in units of sectors between the buffer memory and the random data input/output circuit.

In this exemplary embodiment, the page unit comprises at least one sector.

Another aspect of the present invention is to provide a flash memory system comprising: a flash memory to store data in units of pages; a buffer memory to store data in units of sectors; a random data input/output circuit for receiving data in units of sectors from the buffer memory or outputting data to the buffer memory in units of sectors, and outputting the data in units of pages to the flash memory or receiving the data in units of pages from the flash memory; a register to store information on a command, a buffer sector count, a flash sector address and a buffer sector address; and a state machine for controlling the order and the number of times of inputting/outputting data in units of sectors between the buffer memory and the random data input/output circuit in response to the information stored in the register.

In this embodiment, the flash memory system further comprises an error correction and data input/output circuit, which is controlled by the state machine, for correcting errors of data transmitted between the flash memory and the buffer memory.

In this embodiment, the error correction and data input/output circuit generate a parity in units of sectors.

In this embodiment, the error correction and data input/output circuit corrects errors according to the number of sectors constituting the page.

In this embodiment, the flash memory system further comprises a host interface, which is connected to a host through a bus, for converting a signal received from the host into an internal signal for driving the flash memory system.

In this embodiment, the host interface has an interface type of NOR flash memory.

In this embodiment, the host interface has an interface type of the buffer memory.

In this embodiment, the flash memory, the buffer memory, the random data input/output circuit, the register, the state machine, the error correction and data input/output circuit and the host interface are integrated in one chip.

In this embodiment, the flash memory comprises a main region and a spare region. Normal data is stored in the main region and additional data related to the normal data is stored in the spare region.

In this embodiment, each of the main region and the spare region consists of sectors.

In this embodiment, the buffer memory is a random access memory (RAM) and the RAM is an SRAM or a DRAM.

In this embodiment, the unit page consists of at least one sector.

In this embodiment, the number of times of inputting/outputting data in units of sectors between the buffer memory and the random data input/output circuit is the number of sectors.

In this embodiment, the random data input/output circuit comprises: a latch circuit to store data outputted to the flash memory or received from the flash memory; an input/output buffer for receiving a control signal from the state machine to generate an internal control signal, and receiving data from the state machine and the buffer memory to output a command, an address and data; a command input circuit for receiving a command from the input/output buffer to output reset signals; an address setting pulse generating circuit for receiving an internal control signal from the input/output buffer to output column address setting pulses c1 and c2 and/or row address setting pulses r1 and r2; an address counter for receiving the column and/or row address setting pulses from the address setting pulse generating circuit to output the column and row addresses, increasing the column address in order according to the predetermined number of cycles, and receiving a reset signal from the command input circuit to initialize the column address; a selection circuit for receiving the column address from the address counter to output a sector selection signal to the latch circuit; and a data input/output circuit for receiving data from the input/output buffer to output data to the latch circuit and receiving data from the latch circuit to output the data to the latch circuit, and for receiving data from the latch circuit to output the data to the input/output buffer.

In this embodiment, the latch circuit is initialized by receiving a reset signal from the command input circuit.

In this embodiment, the command input circuit, the address setting pulse generating circuit and the data input/output circuit are activated by a combination of the internal control signals.

In this embodiment, the selection circuit includes a row decoder for receiving a row address from the address counter to output a signal for selecting the word line; and a column decoder for receiving a column address from the address counter to output a signal for selecting the bit line.

In this embodiment, the address setting pulse generating circuit receives a reset signal from the command input circuit to block the row address setting pulse.

A random data input/output circuit according to the present invention is connected to a flash memory. The random data input/output circuit comprises: a latch circuit to store data that is to be outputted to the flash memory or inputted from the flash memory; a command input circuit for receiving a command from an input/output line to output reset signals; an address counter for receiving an address from the input/output line to generate the address, increasing the address in order according to a predetermined number of cycles, and receiving a reset signal from the command input circuit to initialize the address; a selection circuit for receiving an address from the address counter to generate a sector selection signal; and a data input/output circuit for receiving a sector selecting signal from the selection circuit to selects a sector of the latch circuit, receiving data in units of sectors from the input/output line to output data to the selected sector of the latch circuit, and receiving the data in units of sectors from the selected sector of the latch circuit to output the data to the input/output line.

In this embodiment, an input/output buffer is further included. The input/output buffer receives the external control signal from a control line to output an internal control signal, and receives external data from the input/output line to output a command, an address and data, wherein the input/output buffer is connected to the input/output line.

In this embodiment, the latch circuit is initialized by receiving a reset signal from the command input circuit.

In this embodiment, the command input circuit, the address counter and the data input/output circuit are activated by a combination of the internal control signals.

In this embodiment, the selection circuit includes a row decoder and a column decoder.

Still another aspect of the present invention is to provide a random data input/output circuit is connected to a flash memory through a word line and a bit line. The random data input/output circuit comprises: a latch circuit to store data that is to be outputted in the flash memory or received from the flash memory; an input/output buffer for receiving an external signal from a control line to output an internal control signal and receiving external data from the input/output line to output a command, an address and data; a command input circuit for receiving a command from the input/output buffer to output reset signals; an address setting pulse generating circuit for receiving an internal control signal from the input/output buffer to output column address setting pulses c1 and c2 and/or row address setting pulses r1 and r2; an address counter for receiving the column and/or row address setting pulses from the address setting pulse generating circuit to output column and row addresses, increasing the column address in order according to the predetermined number of cycles, and receiving a reset signal from the command input circuit to initialize the column address; a selection circuit for receiving the column address from the address counter to output a sector selection signal to the latch circuit; and a data input/output circuit for receiving data from the input/output buffer to output the data to the latch circuit, and receiving the data from the latch circuit to output the data to the input/output buffer.

In this embodiment, the latch circuit is initialized by receiving a reset signal from the command input circuit.

In this embodiment, the command input circuit, the address setting pulse generating circuit and the data input/output circuit are activated by a combination of the internal control signals.

In this embodiment, the selection circuit comprises a row decoder for receiving a row address from the address counter to output a signal for selecting the word line; and a column decoder for receiving a column address from the address counter to output a signal for selecting the bit line.

In this embodiment, the address setting pulse generating circuit receives a reset signal from the command input circuit to block the row address setting pulse.

BRIEF DESCRIPTION OF THE DRAWINGS

The accompanying drawings are included to provide a further understanding of the invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the invention to those skilled in the art. Like numerals refer to like elements throughout the specification.

Hereinafter, an exemplary embodiment of the present invention will be described in conjunction with the accompanying drawings.

A flash memory system according to the present invention adapts a method for controlling small block flash memory to a large block flash memory using a random data input/output circuit. Assume that the large block flash memory has a page size of (2K+64) Bytes, and the small block flash memory has a page size of (512+16) Bytes. In this case, a sector is defined to have a size of (512+16) Bytes (i.e. the page size of the small block flash memory). That is, one page of the large block flash memory comprises four sectors. The sector is a basic unit in a random data input/output for the large block flash memory.

Figure 1:
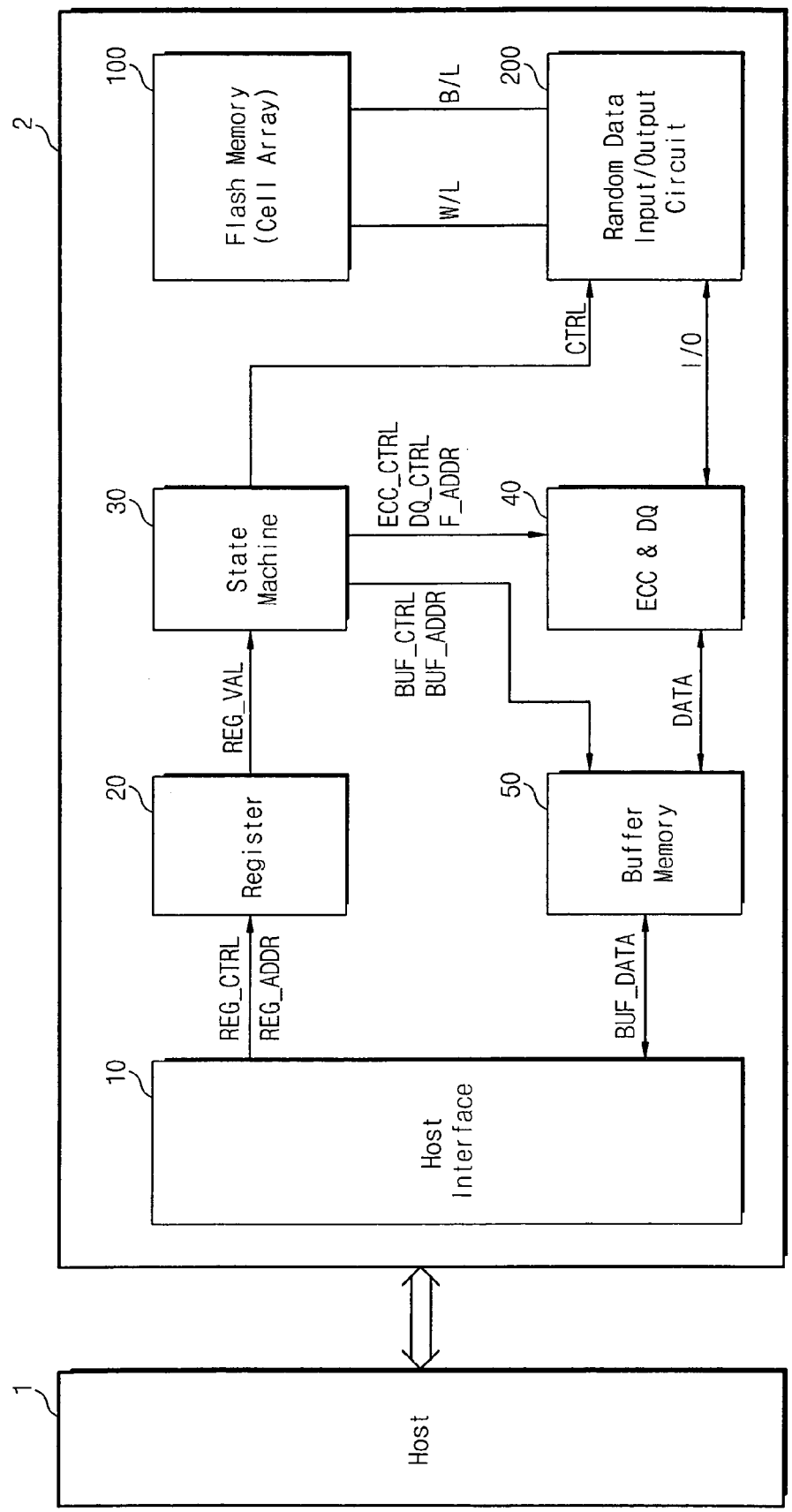
FIG. 1 is a block diagram illustrating an exemplary embodiment of a flash memory system according to the present invention.

FIG. 1 is a block diagram illustrating one exemplary embodiment of a flash memory system in accordance with a flash memory. The flash memory system 2 is connected to a host 1 through a bus. The flash memory system 2 receives external signals such as a control signal, an address and an external signal.

Referring to FIG. 1, the flash memory system 2 includes a host interface 10, a register 20, a state machine 30, an ECC&DQ block 40, a buffer memory 50, a flash memory 100, and a random data input/output circuit 200.

The host interface 10 is connected to the host 1 through a bus. The host interface 10 receives external signals from the host 1. The host interface 10 converts the external signals into internal signals. In this case, the internal signals refer to a control signal, an address, data, etc. The host interface 10 outputs the internal signals to the register 20 or the buffer memory 50.

The host interface 10 may be embodied in various interface methods. For example, the host interface 10 may be configured in an SRAM method or a DRAM method. For example, the host interface 10 may be configured in a NOR flash memory interface method.

The register 20 receives a register control signal REG_CTRL, a register address REG_ADDR, etc. from the host interface 10. The register control signal controls the whole operation of the register 20.

The register 20 has a self-address. The address of register 20 stores information on commands, buffer sector count, address of the flash memory 100, and the address of the buffer memory 50.

The information on commands is to instruct, for example, a reading or writing operation of the flash memory 100. The information on commands includes a normal data input command, a random data input command, a normal data output command, and a random data output command. The commands will be fully explained with reference to FIG. 5.

The information on buffer sector count (BSC) relates to the number of inputting/outputting data in units of sectors in the random data input/output circuit 200. For example, if BSC=4, the data input or output operation is repeated four times continuously. If BSC=2, an input or output operation in units of sectors is repeated only twice.

The information on the address relates to a flash block address (FBA), a flash sector address (FSA), a buffer sector address (BSA), and so on.

The flash block address indicates a memory block of the flash memory 100. The flash sector address is related to one sector of the flash memory 100 (hereafter, referred to as "a flash sector"). The buffer sector address is related to one sector of the buffer memory 50 (hereafter, referred to as "a buffer sector").

The state machine 30 receives from a register value REG_VAL from the register 20. In this case, the register value includes a command, a buffer sector count, a flash sector address, and a buffer sector address. The state machine 30 controls the buffer memory 50 and the random data input/output circuit 200 so as to input the data stored in the buffer sectors to the flash sectors or to output the data stored in the flash sectors to the buffer sectors.

The state machine 30 outputs a control signal CTRL and a flash address R_ADDR to the buffer memory 50. The buffer control signal is for controlling operations of the buffer memory 50. The buffer address is for indicating a buffer sector of the buffer memory 50.

The state machine 30 outputs the control signal BUF_CTRL and the flash address BUF_ADDR to the random data input/output circuit 200. The flash address is inputted to the random data input/output circuit 200 via the ECC&DQ block 40. The control signal is for controlling the random data input/output circuit 200. The flash address is for indicating a flash sector.

The ECC&DQ block 40 is an error correction and data input/output block. The ECC&DQ block 40 receives control signals ECC_CTRL and DQ_CTRL and a flash address F_ADDR from the state machine 30. The control signals ECC_CTRL and DQ_CTRL are for controlling the operation of ECC&DQ block 40. The flash address is a flash sector address FSA of the flash memory 100. The flash address is inputted to the random data input/output circuit 200 via the ECC&DQ block 40.

The ECC&DQ block 40 receives data DATA from the buffer memory 50 to output the data DATA to the random data input/output circuit 200. In addition, the ECC&DQ block 40 receives the data DATA from the random data input/output circuit 200 to output the data DATA to the buffer memory 50.

The ECC&DQ block 40 corrects errors of the data transmitted between the flash memory 100 and the buffer memory 50 as in a manner well known in the art. The ECC&DQ block 40 generates parities in units of sectors, and corrects the errors as many as the number of sectors.

Continuing to refer to FIG. 1, the flash memory system 2 includes a flash memory 100 and a buffer memory 50. The flash memory 100 means a cell array. The flash memory system 2 stores data in the buffer memory 50 temporarily before the data is inputted to the flash memory 100. In addition, the data stored in the flash memory 100 is temporarily stored in the buffer memory 50 before being transmitted to the host 1.

Figure 2:
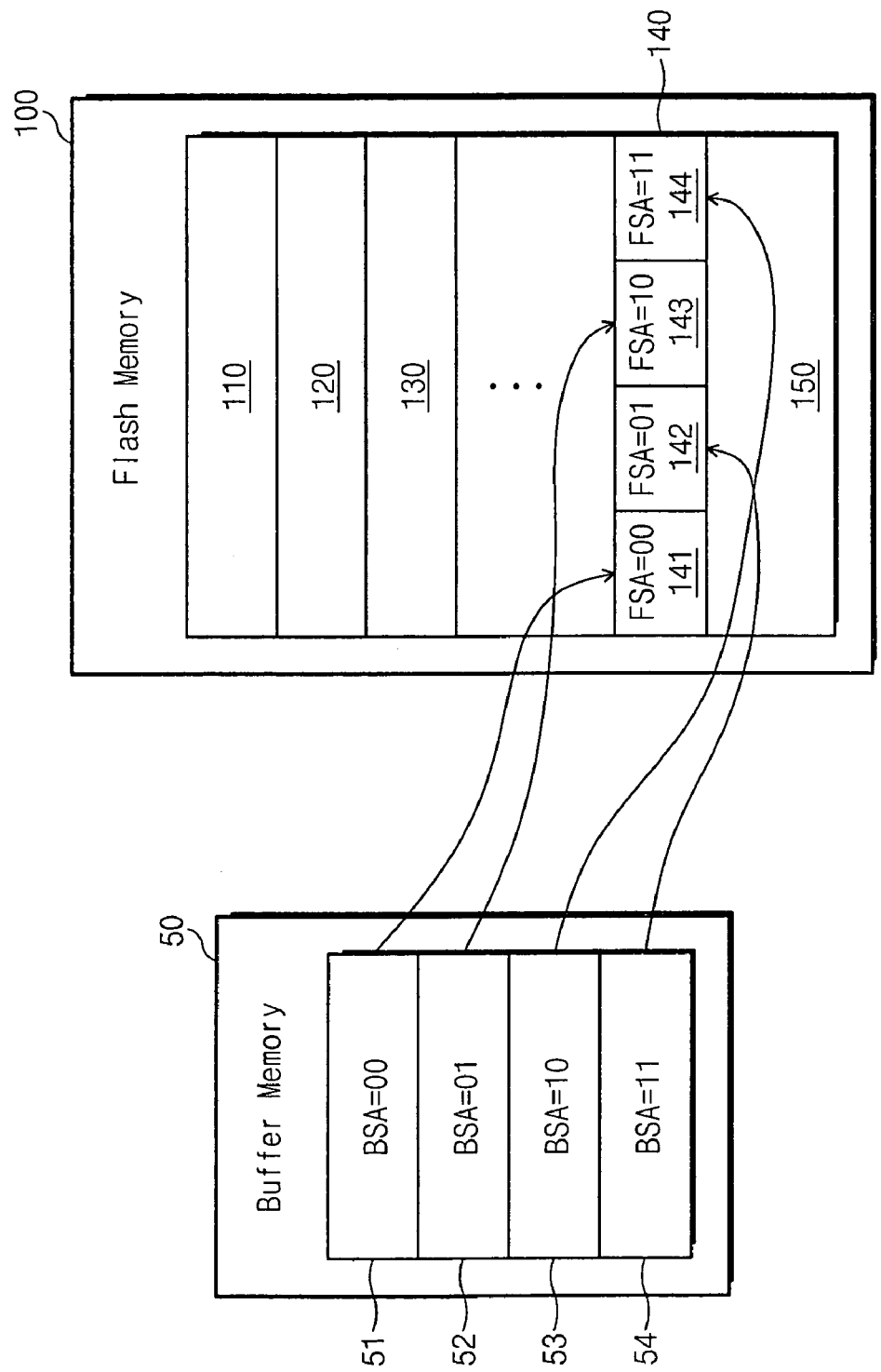
FIG. 2 is a concept diagram of the flash memory and the buffer memory in FIG. 1.

FIG. 2 illustrates a flash memory and a buffer memory. A random data input/output method will be explained with reference to FIG. 2, wherein the random data input/output method is performed by the flash memory 100, the buffer memory 50, and the sector.

The flash memory (a cell array) comprises a plurality of blocks (e.g., 1024 blocks or 2048 blocks). Only one block is illustrated in FIG. 2. The block comprises a plurality of pages (e.g., 16 pages, 32 pages or 64 pages). The reference numbers 110, 120, 130, 140 and 150 in FIG. 2 each denote one page. The page is a basic unit of the operations of writing data and reading data.

Each page comprises a plurality of sectors. FIG. 2 illustrates an exemplary embodiment of one page 140 comprising 4 sectors 141~144. In the flash memory, a page size is (2K+64) bytes and a sector size is (512+16) bytes. The sector is a page of the small block flash memory. The sector is a basic unit of the random data input/output in the large block flash memory.

Meanwhile, the sectors of the flash memory 100 each have an address. Four flash sector addresses (FSA) are illustrated in FIG. 2. An address of the first flash sector 141 is '00'. 'FSA=00' means that the address of the first flash sector 141 is '00'. An address of the second flash sector 142 is '01'. An address of the third flash sector 143 is '10'. An address of the fourth flash sector 144 is '11'.

The buffer memory 50 temporarily stores data received from the flash memory 100 or outputted to the flash memory 100. The buffer memory 50 is capable of accessing at random (e.g., an SRAM or a DRAM). The buffer memory 50 includes buffer sectors 51~54 corresponding to the flash sectors of the flash memory 100.

The buffer sectors 51~54 each include a buffer address sector (BAS). The address of the first buffer sector 51 is '00'. 'BSA=00' means that an address of the first buffer sector 51 is '00'. An address of the second buffer sector 52 is '01'. An address of third buffer sector 53 is '10'. An address of the fourth buffer sector 54 is '11'.

Referring to FIG. 2, a random data input method is explained. The random data input is inputting the data stored in a specific buffer sector of the buffer memory 50 to a specific flash sector of the flash memory 100.

For example, if a command for instructing the random data input of the register 20, including a buffer sector count BSC=1, the second buffer sector address BSA=01, and the third flash sector address FSA=10, are stored in the register 20, the data stored in the second buffer sector 52 is inputted to the third flash sector 143.

FIG. 2 illustrates an exemplary embodiment of a random data input method in case of BSC=4. The data stored in the first buffer sector 51 is inputted to the first flash sector address FSA=00. The data stored in the second buffer sector 52 is inputted to the third flash sector address FSA=10. The data stored in the third buffer sector 53 is inputted to the fourth flash sector address FSA=11. The data stored in the fourth buffer sector 54 is inputted to the second flash sector address FSA=01. Therefore, the data stored in the buffer sectors 51~54 of the buffer memory 50 is inputted to page 140 of the flash memory 100.

If BSC=2, an operation of inputting data in units of sectors is repeated only twice. Therefore, only the data in the first and second buffer sectors 51 and 52 are inputted to the first and third flash sector 141 and 143 of the flash memory 100, respectively.

Again, referring to FIG. 1, the flash memory system 2 further includes a random data input/output circuit 200. The random data input/output circuit 200 enables a random data input/output between the flash memory 100 and the buffer memory 50.

The random data input/output circuit 200 receives a control signal CTRL from the state machine 30. The random data input/output circuit 200 receives a command, an address, and data through an input/output line I/O. The random data input/output circuit 200 is connected to the flash memory 100 through a word line and a bit line.

The random data input/output circuit 200 receives data in units of sectors through the input/output line I/O to output the data in units of pages to the flash memory 100. In addition, the random data input/output circuit 200 receives the data in units of pages from the flash memory 100 to output the data in units of sectors to the input/output line I/O. In this case, the state machine 30 controls the order and the number of times of inputting/outputting data in units of sectors.

Figure 3:
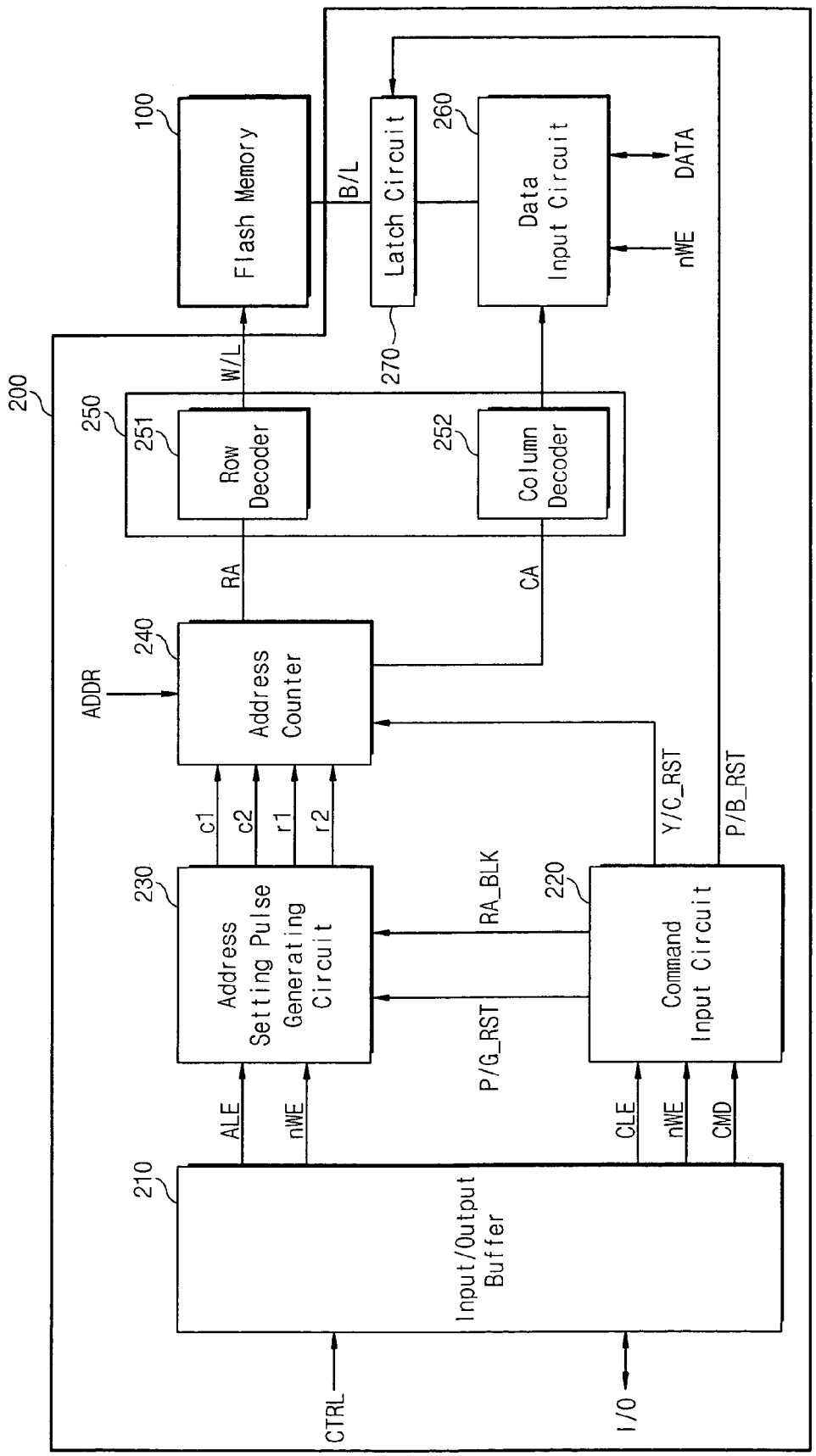
FIG. 3 is a block diagram of a random data input/output circuit according to the present invention.

FIG. 3 is a block diagram illustrating an exemplary embodiment of a random data input/output circuit. Referring to FIG. 3, the random data input/output circuit 200 includes an input/output buffer 210, a command input circuit 220, an address setting pulse generating circuit 230, an address counter 240, a selection circuit 250, a data input/output circuit 260 and a latch circuit 270.

The latch circuit 270 stores data that is to be outputted to the flash memory 100 or that is received from the flash memory 100. The latch circuit 270 comprises page buffers.

Figure 4:
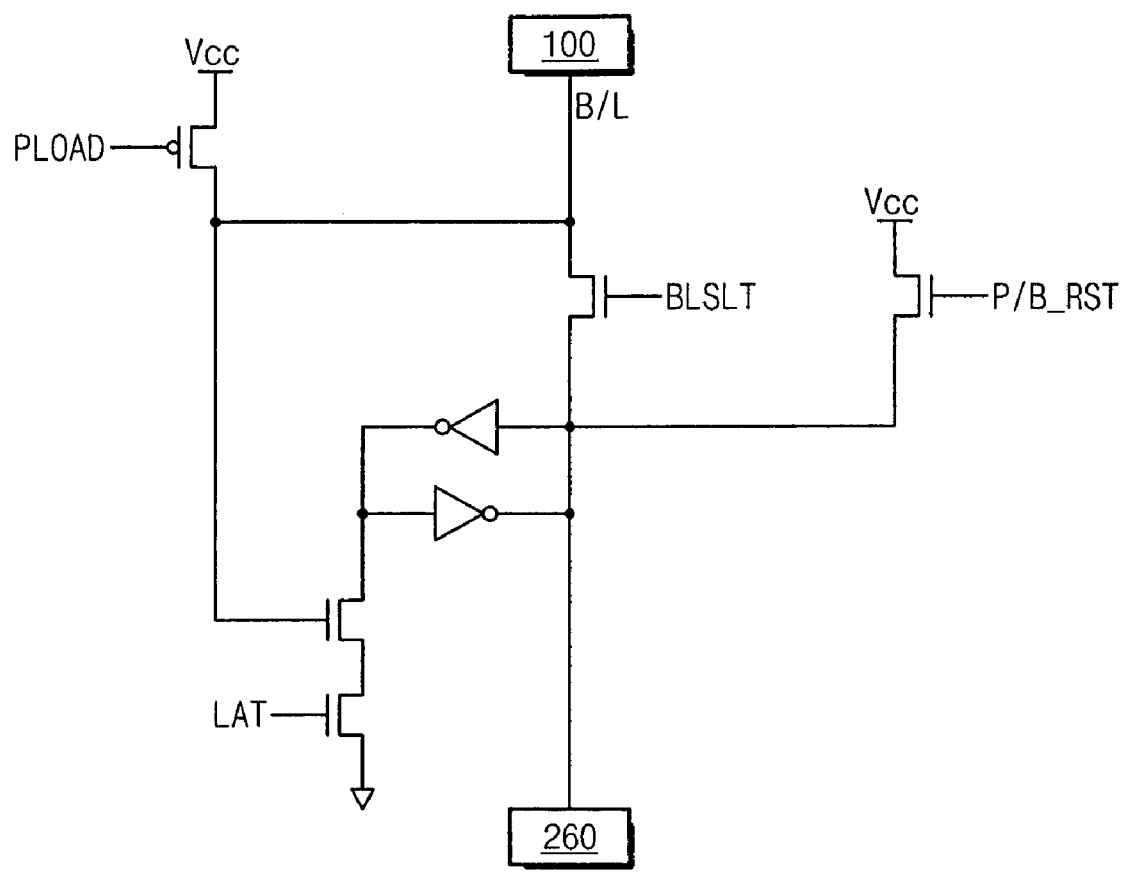
FIG. 4 is a circuit diagram of an exemplary embodiment of the latch circuit in FIG. 3.

FIG. 4 is a circuit diagram illustrating an exemplary embodiment of the latch circuit. The latch circuit includes a PMOS transistor, a latch, a selection transistor and a unit for initializing the latch by a reset signal P/B_RST. The PMOS transistor precharges a bit line B/L in response to a signal PLOAD. The latch comprises two inverters and stores data. The selection transistor switches the bit line in response to a signal BLSLT.

The input/output buffer 210 receives a control signal CTRL from the state machine 30 to output internal control signals (e.g., CLE, ALE, nWE, nRE, nCE, etc.). In addition, the input/output buffer 210 receives a command CMD, an address ADDR and data DATA from an input/output line I/O, and outputs the data DATA to the input/output line.

The command input circuit 220 receives a command CMD from the input/output buffer 210 in synchronization with the internal control signals CLE and nWE. The command input circuit 220 outputs reset signals P/B_RST, Y/C_RST and P/G_RST and a block signal (☐☐☐☐) RA_BLK in response to the command CMD. In this case, the control signal CLE is a command latch enable signal. The command CMD is inputted when the command latch enable signal CLE is high. The control signal nWE is a write enable signal. The command CMD is inputted in synchronization with a low-to-high transition of the write enable signal nWE.

Meanwhile, the command CMD is controlled by the state machine 30. The command CMD includes a normal input command Normal DI CMD for instructing a normal operation of inputting data, a random input command Random DI CMD for instructing a random operation of inputting data, a normal output command Normal DO CMD for instructing a normal operation of outputting data, and a random output command Random_DO_CMD for instructing a random operation of outputting data.

Figure 5:
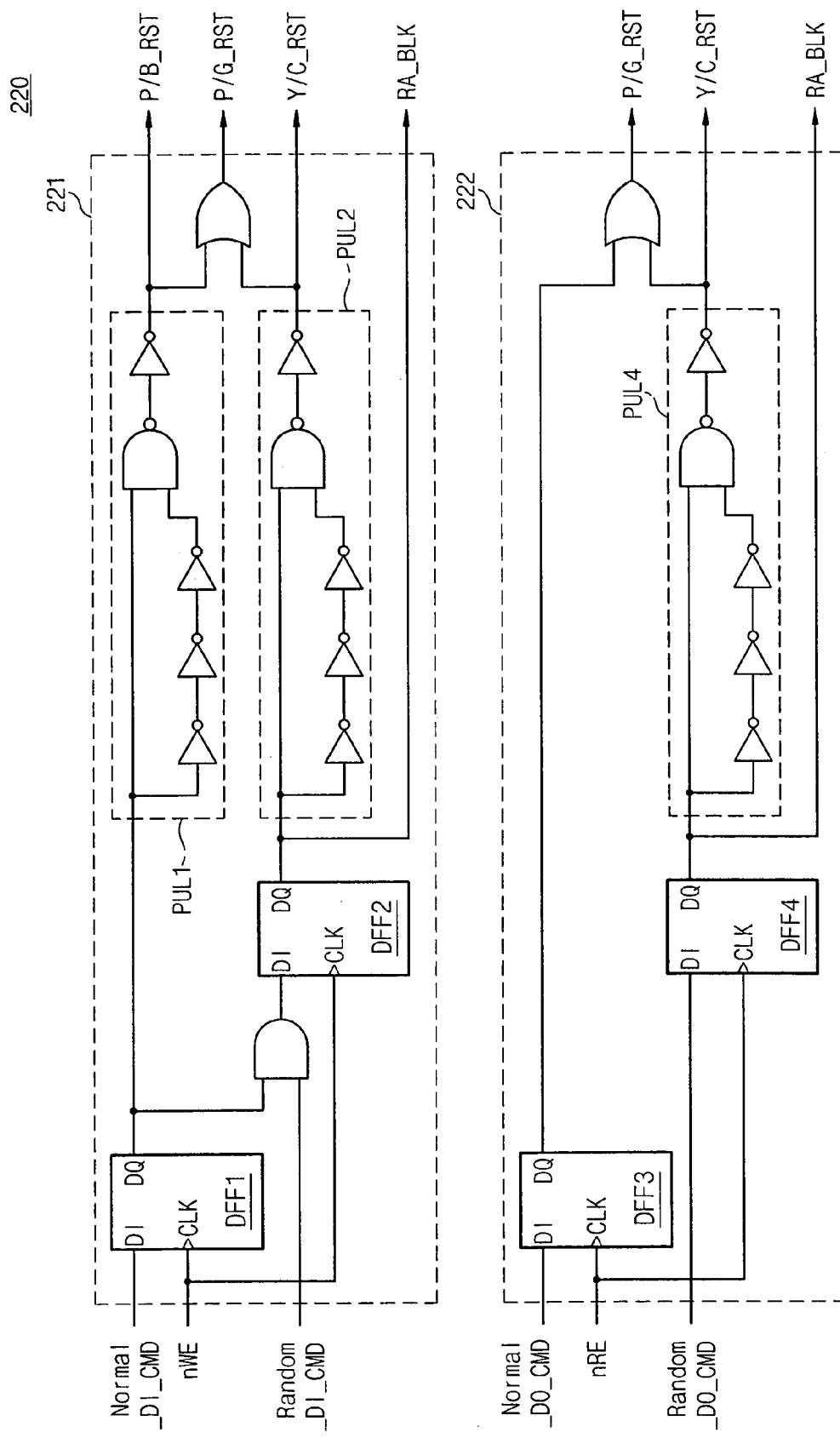
FIG. 5 is a circuit diagram of an exemplary embodiment of the command input circuit in FIG. 3.

FIG. 5 is a circuit diagram illustrating an exemplary embodiment of the command input circuit. The command input circuit 220 comprises a first command input circuit 221 and a second command input circuit 222.

The first command input circuit 221 relates to an operation of inputting data. The first command input circuit 221 receives a control signal nWE and commands Normal_DI_CMD and Random_DI_CMD from the input/output buffer 210 to generate reset signals P/B_RST, P/G_RST and Y/C_RST or a block signal RA_BLK.

The first command input circuit 221 comprises two flipflops DFF1 and DFF2, two short pulse generating circuits PUL1 and PUL2 and gates. The short pulse generating circuits PUL1 and PUL2 comprise three inverters that are connected in series, a NAND gate, and an inverter. The normal input command is synchronized with a control signal nWE to become a reset signal P/B_RST for initializing the latch circuit 270 and a reset signal P/G_RST for initializing the address setting pulse generating circuit 230 via the short pulse generating circuit PUL1. The first command input circuit 221 receives the normal input command to output a signal for initializing the latch circuit 270 and the address setting pulse generator circuit 230.

The random input command becomes a reset signal Y/C_RST for initializing the address counter 240 and a reset signal P/G_RST for initializing the address setting pulse generating circuit 230 via a flipflop DFF2 and the short pulse generating circuit PUL2. Meanwhile, the random input command becomes a signal RA_BLK for blocking low address setting pulses r1 and r2 of the address setting pulse generating circuit 230 via the random input command. The first command input circuit 221 receives the random input command to output a signal for initializing the address counter 240 and the address setting pulse generator circuit 230.

The second command input circuit 222 is a command input circuit relating to a data output. The second command input circuit 222 comprises two flipflops DFF3 and DFF4, one short pulse generating circuit PUL4 and an OR gate. The short pulse generator circuit PUL4 comprises three inverters connected in series, a NAND gate, and an inverter.

The second command input circuit 222 receives a control signal nWE and commands Normal_DO_CMD and Random_DO_CMD from the input/output buffer 210.

The normal output command becomes a reset signal P/G_RST for initializing the address setting pulse generating circuit 230 via a flipflop DFF3.

The random output command becomes a reset signal Y/C_RST for initializing the address counter 240 and a reset signal P/G_RST for initializing the address setting pulse generating circuit 230 via a flipflop DFF4 and a short pulse generating circuit PUL4. Meanwhile, the random output command becomes a signal RA_BLK for blocking low address setting pulses r1 and r2 of the address setting pulse generating circuit 230 via the flipflop DFF4.

Referring to FIG. 3 again, the random data input/output circuit 200 includes the address setting pulse generating circuit 230. The address setting pulse generating circuit 230 receives control signals ALE and nWE from the input/output buffer 210. The address setting pulse generating circuit 230 outputs the column address setting pulses c1 and c2 and the row address setting pulses r1 an r2 sequentially in synchronization with the control signal ALE and nWE. In this case, the control signal ALE is an address latch enable signal. The address setting pulse generating circuit 230 receives a reset signal P/G_RST and a block signal RA_BLK from the command input circuit 220.

Figure 6:
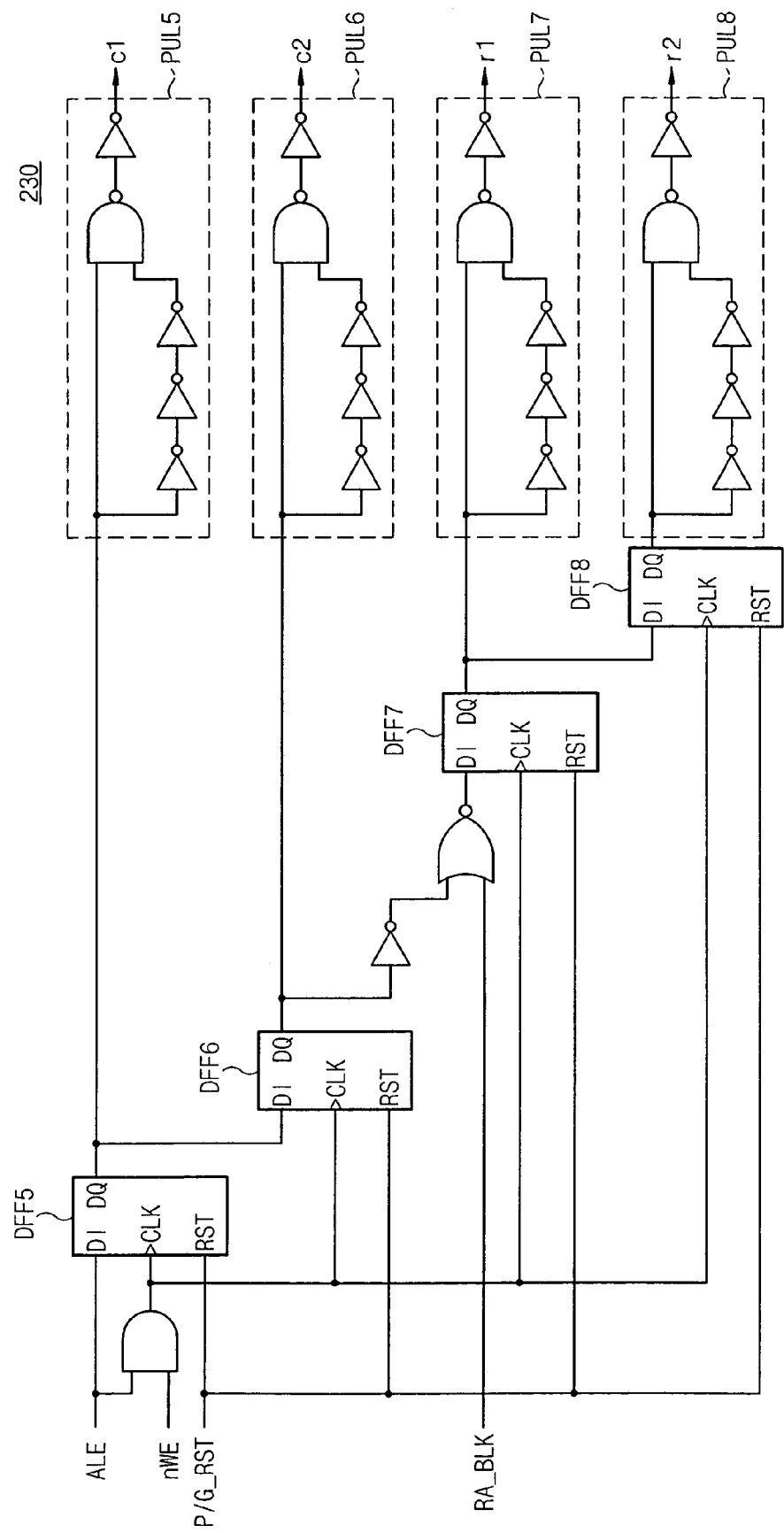
FIG. 6 is a circuit diagram of the address setting pulse generating circuit in FIG. 3.

FIG. 6 is a circuit diagram illustrating an exemplary embodiment of an address setting pulse generating circuit. Referring to FIG. 6, the address setting pulse generating circuit 230 includes filpflops DFFi; i=5~8, short pulse generating circuits PULj; j=5~8, and gates. The address setting pulse generating circuit 230 outputs column and row address setting pulses c1, c2, r1, and r2 sequentially whenever the write enable signal nWE is transitioned while the address latch enable signal ALE is high.

The address latch enable signal ALE is outputted from a flipflop DFF5 in synchronization with a first transition of the write enable signal nWE. The signal outputted from the flipflop DFF5 becomes a first column address setting pulse c1 via the short pulse generating circuit PUL5. The signal outputted from the flipflop DFF5 to input into the flipflop DFF6 is also inputted into the short pulse generating circuit PUL6 in synchronization with a second transition of the write enable signal nWE to become a second address setting pulse c2. First and second row address setting pulses r1 and r2 are outputted in the same process as explained above.

The flipflops DFFi; i=5~8 are initialized by receiving a reset signal P/G_RST from the command input circuit 220. Meanwhile, a NOR gate placed at a front terminal of the flipflop DFF7 receives a block signal RA_BLK from the command input circuit 220. The NOR gate outputs the block signal RA_BLK from the command input circuit 220 unconditionally. An output signal DQ of the flipflop DFF7 is disabled when the block signal RA_BLK is high. The disabled output signal of the flipflop DFF7 is inputted in the flipflop DFF8. Therefore, row address setting pulses r1 and r2 are interrupted when the address setting pulse generating circuit 230 receives a block signal RA_BLK from the command input circuit 220.

The column address setting pulse r1 and r2 are blocked when a random input command or a random output command are inputted because a column address is maintained as it is set when the normal input command or the normal output command is introduced.

Referring to FIG. 3 again, the random data input/output circuit 200 includes an address counter 240. The address counter 240 receives address setting pulses from the address setting pulse generator circuit 230. The address counter 240 receives the address ADDR from the input/output buffer 210 in synchronization with the address setting pulses. The address counter 240 generates a column address CA in synchronization with column address setting pulses c1 and c2. The address counter 240 generates a row address RA in synchronization with column address setting pulses r1 and r2.

The address counter 240 increases the column address according to the number of predetermined cycles in order. The predetermined number of cycles is the number of cycles of the write enable signal nWE required for inputting/outputting data to/from one sector. That is, the address determines a start point of sector and the predetermined number of cycles determines an end point of the sector.

The address counter 240 receives a reset signal Y/C_RST from the command input circuit 220. The address counter 240 is initialized by the reset signal Y/C_RST. The reset signal Y/C_RST is generated by a random input command Random_DI_CMD or a random output command Random_DO_CMD.

The selection circuit 250 receives row column addresses from the address counter 240. The selection circuit 250 generates a signal to select a word line and a bit line in response to the row and column addresses. The selection circuit 250 includes a row decoder 251 and a column decoder 252. The row decoder 251 generates a word line selection signal in response to the row address. The column decoder 252 selects a bit line selection signal in response to the column address.

The data input/output circuit 260 receives the bit line selection signal from the selection circuit 250. A sector unit of the latch circuit 270 is selected by the bit line selection signal. That is, a start point of the sector where the data is inputted or outputted is determined by the bit line selection signal.

The data input/output circuit 260 receives control signals nWE and nRE and data DATA from the input/output buffer 210. The data input/output circuit 260 receives data in units of bytes (or words) in synchronization with a continuous low-to-high transition of the control signal nWE. In this case, an end point of the sector inputted in the latch circuit 270 is determined by the number of cycles of the control signal nWE.

The data input/output circuit 260 outputs data in the input/output buffer 210 in synchronization with a continuous transition of the control signal nRE. In this case, the control signal nRE is a read enable signal. The data DATA is outputted in synchronization with a continuous low-to-high transition.

Figure 7:
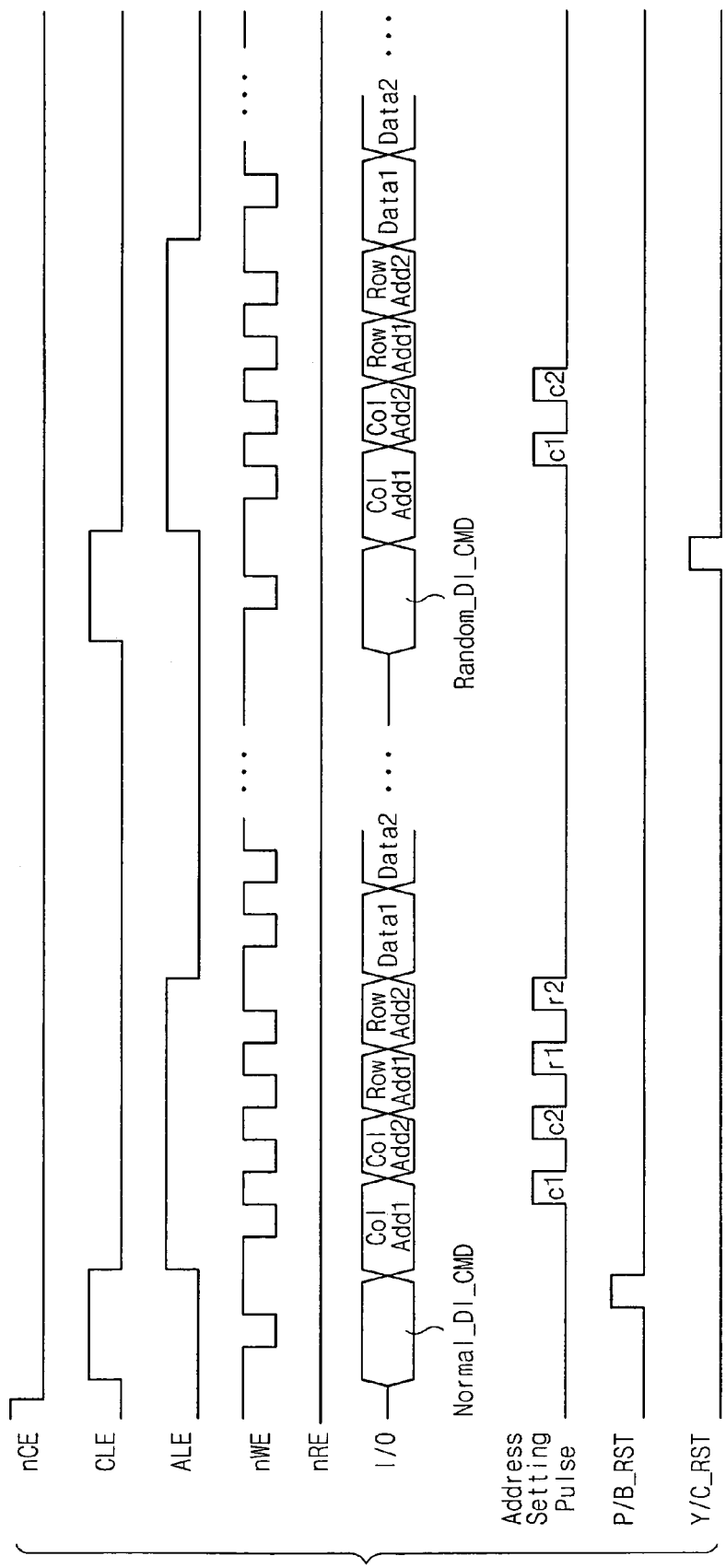
FIG. 7 is a timing diagram illustrating an operation of inputting data at random in units of sectors.

FIG. 7 is a timing diagram illustrating a random data input operation in units of sectors. Referring to FIG. 7, a data input operation of the random data input/output circuit 200 will be explained as follows. The random data input/output circuit 200 receives a normal input command Normal_DI_CMD through an input/output line I/O in synchronization with a write enable signal nWE when a chip enable signal nCE is low and a command latch enable signal CLE is high. A reset signal (P/B_RST) for initializing the latch circuit 270 is generated by the normal input command.

When the chip enable signal nCE is low, and an address latch enable signal ALE is high, address setting pulse signals c1, c2, r1 and r2 are generated in order in synchronization of a continuous transition of the write enable signal nWE. Row and column addresses are inputted in synchronization with the address setting pulse signal.

When the chip enable signal nCE, the command latch enable signal CLE and the address latch enable signal ALE are all low, data is inputted in synchronization with the continuous transition of the write enable signal nWE. The data is inputted in units of bytes (or words) according to the number of cycles of the write enable signal nWE. For example, if one of the sectors is 512 bytes and 1 byte is inputted at each cycle of the write enable signal nWE, the number of cycles of the write enable signal nWE is 512. In this case, the number of 512 cycles is the same as that of address counter 240.

Next, a random data input operation is performed. The random data input/output circuit 200 receives a random input command Random_DI_CMD in synchronization with a write enable signal nWE when the chip enable signal nCE is low and the command latch enable signal CLE is high. A reset signal Y/C_RST for initializing the address counter 270 is generated by the random input command.

When the chip enable signal nCE is low, and the address latch enable signal ALE is high, column address setting pulse signals c1 and c2 are generated in order in synchronization with a continuous transition of the write enable signal nWE. The row and column addresses are inputted in synchronization with the address setting pulse signal. In this case, the column address setting pulse signals r1 and r2 are blocked. Therefore, the column address is maintained to the address generated when the normal data is inputted.

When the chip enable signal nCE, the command latch enable signal CLE, and the address latch enable signal ALE are all low, data is inputted in synchronization with continuous transition of write enable signal nWE. The data is inputted in units of bytes according to the number of cycles of the write enable signal nWE. For example, if one of the sectors is 16 bytes and 1 byte is inputted in each cycle of the write enable signal nWE, the number of cycles of the write enable signal nWE is 16.

A normal data input operation and a random data input operation are repeated as many as the number of the buffer sector count BSC stored in the register 20. For instance, if BSC=4, the normal data input operation is performed once and the random data input operation is performed three times.

Figure 8:
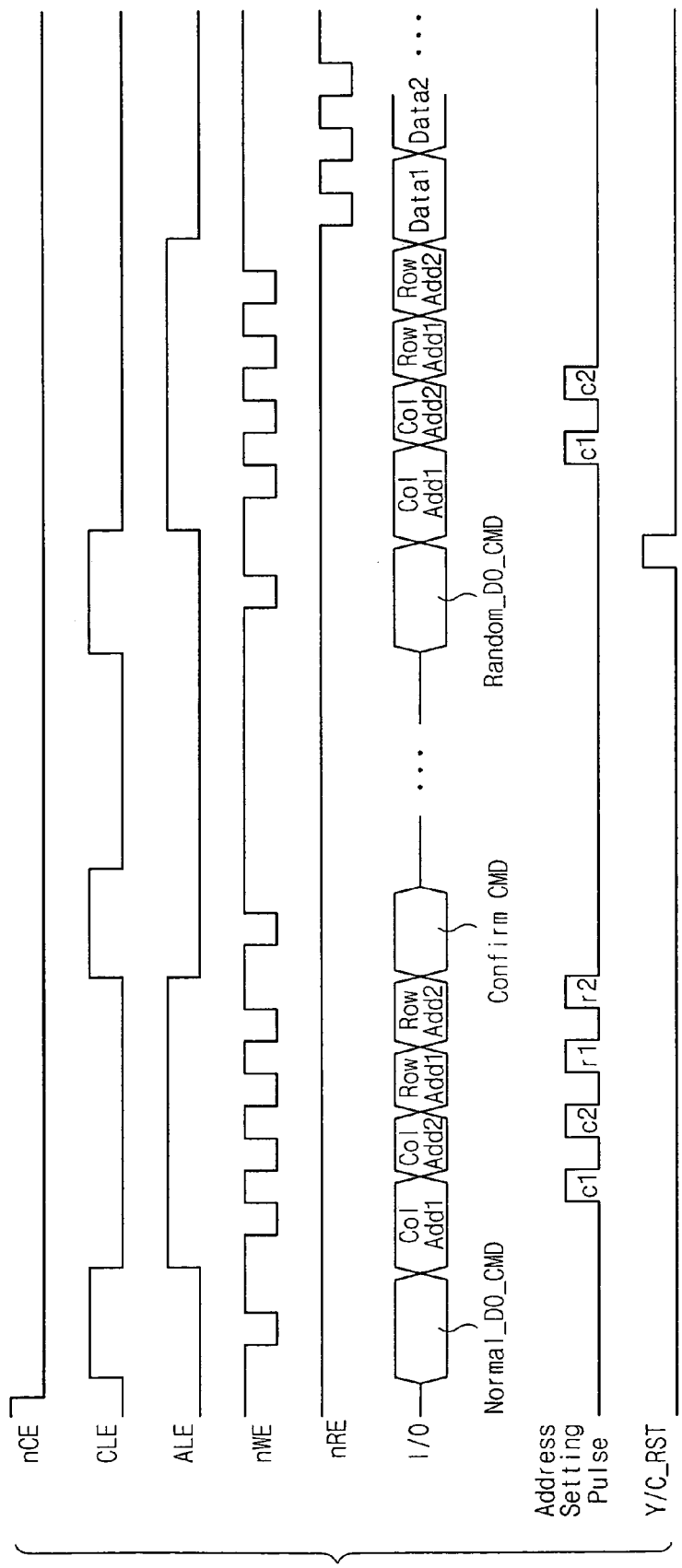
FIG. 8 is a timing diagram illustrating an operation of outputting data at random in units of sectors.

FIG. 8 is a timing diagram illustrating a random data output operation in units of sectors. Referring to FIG. 8, the data output operation of the random data input/output circuit 200 will explained as follows.

The random data input/output circuit 200 receives a normal output command Normal_DO_CMD in synchronization with the write enable signal nWE when the chip enable signal nCE is low and the command latch enable signal CLE is high.

When the chip enable signal nCE is low, and the address latch enable signal ALE is high, the setting pulse signals c1, c2, r1 and r2 are generated in order in synchronization with continuous transition of write enable signal nWE. The row and column addresses are generated in synchronization with the address setting pulse signal.

When the chip enable signal nCE is low and the command latch enable signal CLE is high, a confirm command Confirm_CMD for instructing a data output operation is received in synchronization with the write enable signal nWE. The data stored in the flash memory 100 is outputted to the latch circuit 270 in units of pages by the confirm command.

Then, the random data output operation is performed by units of sectors. The random data input/output circuit 200 receives a random output command Random_DO_CMD in synchronization with the write enable signal nWE when the chip enable signal nCE is low and the command latch enable signal CLE is high. A reset signal Y/C_RST for initializing the address counter 240 is generated by the random output command.

When the chip enable signal nCE is low and the address latch enable signal ALE is high, the column address setting pulse signals c1 and c2 are generated in order in synchronization with a continuous transition of the write enable signal nWE. The column and row addresses are inputted in synchronization with the address setting pulse signal. In this case, the row address setting pulse signal r1 and r2 are blocked. Therefore, the row address is maintained as the address that is generated when the normal data is outputted.

When the chip enable signal nCE, the command latch enable signal CLE, and the address latch enable signal ALE are all low, data is outputted in units of sectors in synchronization with the continuous transition of the write enable signal nRE. The data is outputted in units of bytes (or words) according to the number of cycles of the write enable signal nRE. If one sector is 512 bytes and 1 byte is outputted in each cycle of the write enable signal nRE, for instance, the number of cycles of the write enable signal nRE is 512. In this case, the 512 number of cycles is the same as that of the address counter 240.

The data output operation is repeated by a buffer sector count BSC stored in the register 20. For example, if BSC=3, the random data output operation is carried out repeatedly three times. The components composing the flash memory system 2 (i.e., the flash memory 100, the buffer memory 50, the register 20, the state machine 30, the random data input/output circuit 200, the ECC&DQ block 40 and the host interface 10) may be integrated in one chip. In addition, the flash memory system 2 can be embodied using a multi-chip technology as well known to those skilled in the art.

The flash memory system according to the present invention can input data in a memory or output from the memory in units of sectors. In addition, the flash memory system can control the order and the number of times of inputting/outputting data in units of sectors. Therefore, a large block flash memory capable of performing random data input/output operation can use a large block flash memory by means of a small block flash memory control method, such that an efficiency of storing data can be improved.

Although the present invention has been described in connection with the embodiment of the present invention illustrated in the accompanying drawings, it is not limited thereto. It will be apparent to those skilled in the art that various substitutions, modifications, and changes may be made thereto without departing from the scope and spirit of the invention.

What is claimed is:

1. A flash memory system comprising:
a flash memory to store data in units of pages;
a buffer memory to store data in pages subdivided into units of sectors;
a random data input/output circuit to perform one of receive data in units of sectors from the buffer memory or to output data in units of sectors to the buffer memory, and to perform one of output data in units of pages to the flash memory or to receive data in units of pages from the flash memory, the random data input/output circuit further including:
a latch circuit to store data that is to be either outputted to the flash memory or inputted from the flash memory;
an input/output buffer to receive a control signal from the state machine to output internal control signals and to receive data from the state machine and the buffer memory to output a command, an address, and data;
a command input circuit to receive a command from the input/output buffer to output reset signal;
an address setting pulse generating circuit to receive an internal control signal from the input/output buffer to output column address setting pulses c1 and c2 and/or row address setting pulses r1 and r2;
an address counter to receive the column and/or row address setting pulses from the address setting pulse generating circuit to output a column address and a row address, increasing the column address in order according to a predetermined number of cycles, and to receive the reset signals from the command input circuit to initialize the column address;
a selection circuit to receive the column address from the address counter to output a sector selection signal to the latch circuit; and
a data input/output circuit to receive data from the input/output buffer to output the data to the latch circuit, and to receive data from the latch circuit to output the data to the input/output buffer;
a control circuit to control the order and the number of times of inputting/outputting data in units of sectors between the buffer memory and the random data input/output circuit.

2. The flash memory system of claim 1, wherein the page unit comprises at least one sector.

3. The flash memory system of claim 1, wherein the control circuit further comprises:
a register to store information of a command, a buffer sector count, a flash sector address and a buffer sector address; and
a state machine to control the order and the number of times of inputting/outputting data in units of sectors between the buffer memory and the random data input/output circuit in response to the information stored in the register.

4. The flash memory system of claim 1, wherein the latch circuit is initialized by receiving the reset signal from the command input circuit.

5. The flash memory system of claim 1, wherein the command input circuit, the address setting pulse generating circuit and the data input/output circuit are activated by a combination of the internal control signals.

6. The flash memory system of claim 1, wherein the selection circuit, comprises:
a row decoder to receive the row address from the address counter to output a signal to select a word line; and
a column decoder to receive the column address from the address counter to output a signal to select a bit line.

7. The flash memory system of claim 1, wherein the address setting pulse generating circuit receives the reset signal from the command input circuit to block the row address setting pulses.

8. A flash memory system comprising:
a flash memory to store data in units of pages;
a buffer memory to store data in units of sectors;
a random data input/output circuit to perform one of receive data in units of sectors from the buffer memory or to output data in units of sectors to the buffer memory, and to perform one of output data in units of pages to the flash memory or to receive data in units of pages from the flash memory;
a control circuit to control the order and the number of times of inputting/outputting data in units of sectors between the buffer memory and the random data input/output circuit, the control circuit comprising:
a register to store information of a command, a buffer sector count, a flash sector address and a buffer sector address; and
a state machine to control the order and the number of times of inputting/outputting data in units of sectors between the buffer memory and the random data input/output circuit in response to the information stored in the register;

a latch circuit to store data that is to be either outputted to the flash memory or inputted from the flash memory;

an input/output buffer to receive a control signal from the state machine to output internal control signals and to receive data from the state machine and the buffer memory to output a command, an address, and data;

a command input circuit to receive a command from the input/output buffer to output reset signal;

an address setting pulse generating circuit to receive an internal control signal from the input/output buffer to output column address setting pulses $c1$ and $c2$ and/or row address setting pulses $r1$ and $r2$;

an address counter to receive the column and/or row address setting pulses from the address setting pulse generating circuit to output a column address and a row address, increasing the column address in order according to a predetermined number of cycles, and to receive the reset signals from the command input circuit to initialize the column address;

a selection circuit to receive the column address from the address counter to output a sector selection signal to the latch circuit; and a data input/output circuit to receive data from the input/output buffer to output the data to the latch circuit, and to receive data from the latch circuit to output the data to the input/output buffer.

9. The flash memory system of claim 8, wherein the latch circuit is initialized by receiving the reset signal from the command input circuit.

10. The flash memory system of claim 8, wherein the command input circuit, the address setting pulse generating circuit and the data input/output circuit are activated by a combination of the internal control signals.

11. The flash memory system of claim 8, wherein the selection circuit, comprises:

a row decoder to receive the row address from the address counter to output a signal to select a word line; and a column decoder to receive the column address from the address counter to output a signal to select a bit line.

12. The flash memory system of claim 8, wherein the address setting pulse generating circuit receives the reset signal from the command input circuit to block the row address setting pulses.

* * * * *

UNITED STATES PATENT AND TRADEMARK OFFICE
CERTIFICATE OF CORRECTION

PATENT NO. : 7,212,426 B2 Page 1 of 1
APPLICATION NO. : 10/957166
DATED : May 1, 2007
INVENTOR(S) : Min-Gun Park et al.

It is certified that error appears in the above-identified patent and that said Letters Patent is hereby corrected as shown below:

Column 10, line 11, the word "cl" should read -- c1 --.

Signed and Sealed this

Thirtieth Day of September, 2008

JON W. DUDAS
*Director of the United States Patent and Trademark Office*